United States Patent
Erdeljac et al.

(10) Patent No.: US 6,284,669 B1
(45) Date of Patent: Sep. 4, 2001

(54) POWER TRANSISTOR WITH SILICIDED GATE AND CONTACTS

(75) Inventors: John P. Erdeljac, Plano; Louis N. Hutter, Richardson; Jeffrey P. Smith, Plano; Han-Tzong Yuan, Dallas; Jau-Yuann Yang; Taylor R. Efland, both of Richardson; C. Matthew Thompson, Highland Village; John K. Arch; Mary Ann Murphy, both of Richardson, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/168,194

(22) Filed: Oct. 7, 1998

Related U.S. Application Data

(63) Continuation of application No. 08/767,047, filed on Dec. 16, 1996, now abandoned.
(60) Provisional application No. 60/008,986, filed on Dec. 21, 1995.

(51) Int. Cl.$^7$ .......................... H01L 21/302; H01L 21/461
(52) U.S. Cl. .......................... 438/721; 438/723; 438/725; 438/755; 438/756; 438/785
(58) Field of Search .................................. 438/297, 721, 438/723, 755, 756, 725, 785; 257/288

(56) References Cited

U.S. PATENT DOCUMENTS

| | | | | |
|---|---|---|---|---|
| 4,686,000 | * | 8/1987 | Heath | 438/702 |
| 4,769,686 | * | 9/1988 | Horiuchi et al. | 257/373 |
| 4,908,688 | * | 3/1990 | Lund et al. | 257/383 |
| 5,621,232 | * | 4/1997 | Ohno | 257/288 |
| 5,728,619 | * | 3/1998 | Tsai et al. | 438/297 |

* cited by examiner

Primary Examiner—Eddie Lee
Assistant Examiner—José R. Diaz
(74) Attorney, Agent, or Firm—Warren L. Franz; Wade James Brady, III; Frederick J. Telecky, Jr.

(57) ABSTRACT

A power field effect transistor is disclosed that includes polysilicon gate bodies (40) and (42), which includes platinum silicide contact layers (74) and (78) disposed on the outer surfaces of bodies (40) and (42), respectively. In addition, the device comprises an n+drain region (64) which also has a platinum silicide drain contact layer (76) formed on its outer surface and platinum silicide source contact layers (75) and (77). During formation, sidewall spacers (50) and (52), as well as mask bodies (70) and (72) are used to ensure that platinum silicide layer (76) spaced apart from both gate bodies (40) and (42) and platinum silicide gate contact layers (74) and (78).

4 Claims, 4 Drawing Sheets

POWER TRANSISTOR WITH SILICIDED GATE AND CONTACTS

CROSS REFERENCE TO PRIOR APPLICATIONS

This application is a continuation of Ser. No. 08/767,047, filed Dec. 16, 1996, now abandoned, which claims priority under 37 C.F.R.1.119 based upon Provisional Application Ser. No. 60/008,986, filed Dec. 21, 1995.

TECHNICAL FIELD OF THE INVENTION

This invention relates in general to the field of electronic devices and more particularly to a MOS power transistor having a silicided gate and contacts and a method of forming the same.

BACKGROUND OF THE INVENTION

Field effect transistors that are used in power applications or RF applications must switch significant amounts of current at very high frequencies. The downscaling of these field effect transistors helps reduce the total source to drain resistance and the junction capacitances; both can enhance the power handling capability of the device at high frequencies. As the transistor scales to smaller channel lengths, the gate linewidth gets narrower and the sheet resistance contribution to the RC delay increases, drastically impacting the performance in an RF application. While power transistors do not necessarily have to switch at high speeds, this RC delay increase impacts how uniformly the transistor switches. If a power transistor does not uniformly switch, localized regions of the transistor may be required to conduct more current than can reliably be handled, resulting in destruction of the power transistor. Because of these requirements, various solutions for the processing of low resistivity gate material in conjunction with low resistivity contacts to the source and drain of the transistor have been explored.

One approach for obtaining low resistivity gate material is to use refractory metals such as molybdenum. While providing an extremely low resistivity, molybdenum does require special processing and care such that the deposited film does not lead to unwanted traps in the gate oxide, is completely passivated from oxidizing ambients, and there is a means to reliably etch the material for pattern generation. Also, the molybdenum gate does not address the low contact resistance required in the source and drain regions.

Another approach uses tungsten silicide to form the low resistivity gate of the field effect transistor. Tungsten silicide is able to withstand high process temperatures and provides a resultant resistivity of approximately 70E-6 ohm-cm. This silicide is formed through a cosputtering process of the mixture of metal and silicon. The stability of tungsten silicide during high temperature processing and its means of deposition make it suitable for a polycide process, but it also does not address the source and drain contact regions.

As opposed to the polycide processing, many low-power, low-voltage technologies utilize techniques that silicide the polysilicon gates as well as the active source and drain regions of the transistor. This provides both improved gate resistivity and reduced source/drain resistance required for fast switching. A shortcoming of this approach is that it precludes the manufacturing of high-voltage components as the silicide in both the source and drain regions is adjacent to the poly gate spaced by the sidewall oxide. This results in low voltage transistors through the impact of BVdss. Typical materials used in these techniques are titanium and platinum. Titanium-silicide has a resistivity of approximately 13E-06 to 16E-06 ohm-cm, while platinum-silicide has a resistivity of approximately 28E-06 to 35E-06 ohm-cm. Neither of these materials can withstand the high temperature processing as tungsten silicide can, so this temperature limitation forces the processing to be near the end of the manufacturing process where temperature budgets are much less.

SUMMARY OF THE INVENTION

Accordingly, a need has arisen for a power field effect device which uses platinum silicide to reduce the sheet resistance of the gate, and the contact resistance of the source and drain of the device, but which must keep the platinum silicide regions at a safe distance from one another to prevent low voltage breakdown of the device.

In accordance with the teachings of the present invention, a power transistor is provided that substantially eliminates or reduces disadvantages associated with prior systems and processing methods. According to one embodiment of the present invention, a power transistor is provided that comprises a drain region containing a platinum silicide layer formed in contact with the drain region. The transistor also comprises a gate body having a platinum silicide layer formed in contact with the gate body. The drain region and the platinum silicide drain contact layer are spaced apart from the gate body and the platinum silicide gate contact layer.

DESCRIPTION OF THE DRAWINGS

A more complete understanding of the present invention may be acquired by referring to the accompanying FIGUREs in which like reference numbers indicate like features and wherein.

DETAILED DESCRIPTION OF THE INVENTION

Since the field effect devices used for high-voltage, power, or RF applications are undergoing scaling, it is necessary to provide low resistivity transistor gates, while not adversely impacting the operation voltage of the transistors. The transistor architecture of the present invention provides both of these requirements, low gate resistivity and low source/drain contact resistance, such that operating voltage is not adversely altered, good Schottky diodes can be integrated, and a single silicide strategy can be utilized in a manufacturing environment. The need for the Schottky diode focuses this invention on a platinum-silicide implementation as a single silicide strategy, but if a dual silicide strategy was allowed, this invention could also be implemented using a titanium-silicide poly with platinum-silicided active regions. For example, one embodiment of the present invention provides a transistor that comprises a source and drain region containing a platinum silicide layer formed in the contact regions, a platinum-silicided Schottky diode, and a platinum-silicided polysilicon gate for reduced RC delays.

Figure 1A:
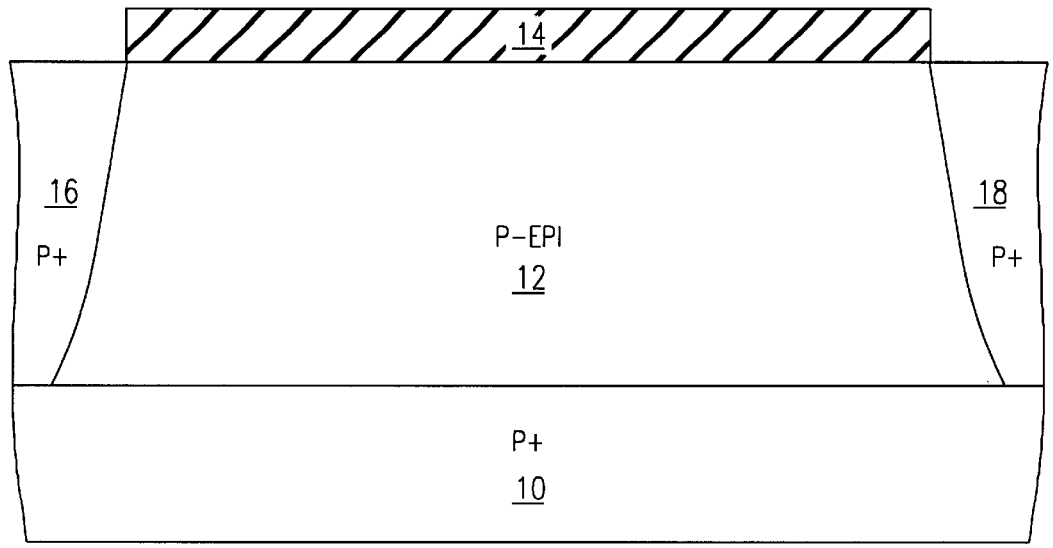
FIGS. 1a through 1h are a series of schematic cross-sectional diagrams illustrating one embodiment of a power transistor constructed according to the teachings of the present invention and the method of the present invention for constructing the same.

FIGS. 1a through 1h illustrate the sequential processing steps which may be used to construct a power field effect transistor according to one embodiment of the present invention. Referring to FIG. 1a, a substrate 10 is doped with sufficient p-type ions such as boron to form a p+ substrate. On the outer surface of p+substrate 10, an epitaxial layer 12 of p-type semiconductor material is grown. The power device of the present invention is constructed in the region proximate the outer surface of epitaxial layer 12. A mask layer of oxide 14 is grown on the outer surface of epitaxial layer 12. Layer 14 is patterned and etched using conventional photolithographic techniques to expose particular portions of the outer portions of epitaxial layer 12. Boron ions are then implanted to create p+ regions 16 and 18 shown in FIG. 1a. Regions 16 and 18 are constructed using a highly energetic implant step and an annealing step. Regions 16 and 18 serve to provide a low resistive back side current path to region 10.

Figure 1B:
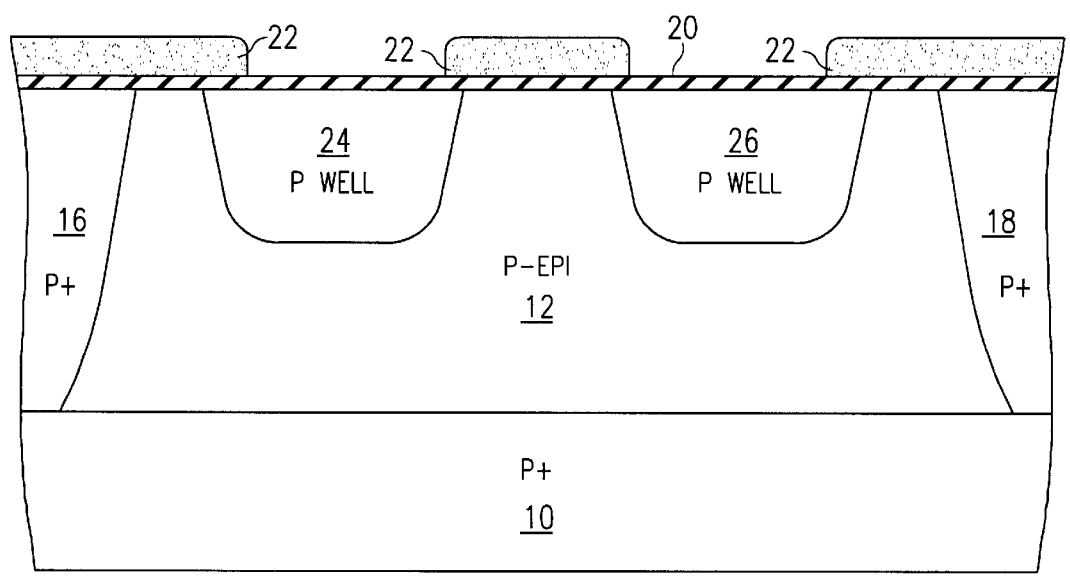
Figure 1C:
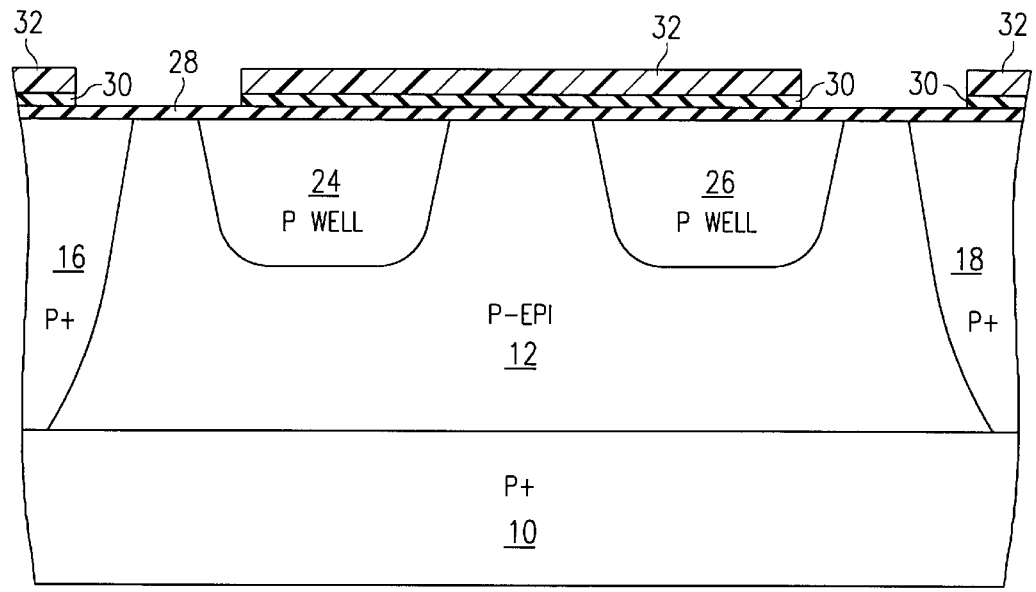

Layer 14 is then stripped from the outer surface of epitaxial layer 12. Referring to FIG. 1b, an oxide layer 20 is then grown on the outer surface of epitaxial layer 12. A layer of photoresist 22 is then deposited and patterned such that openings are formed within the active region shown in FIG. 1b. Additional p-type impurities such as boron are then implanted in the openings in photoresist layer 22 to form p-well regions 24 and 26 shown in FIG. 1b. Although two p-well regions are shown between regions 16 and 18 in FIG. 1b, it should be understood that in the actual construction of the device, many separate p-well regions, or a single p-well region, could be included between regions 16 and 18. After the formation of p-well regions 24 and 26, the photoresist layer 22 and the p-well oxide layer 20 are stripped from the outer surface of epitaxial layer 12. Following this stripping process, a pad oxide layer 28 is grown on the outer surface of epitaxial layer 12. A layer of silicon nitride 30 is then deposited outwardly from the surface of pad oxide layer 28. Silicon nitride layer 30 is then patterned and etched using a layer of photoresist 32 shown in FIG. 1c. Photoresist layer 32 is then stripped and the structure undergoes a local oxidation process whereby the regions of pad oxide layer 28 which are not covered by silicon nitride layer 30 will grow thick oxide regions. In contrast, the areas covered by silicon nitride layer 30 will grow little, if any, further oxide.

Figure 1D:
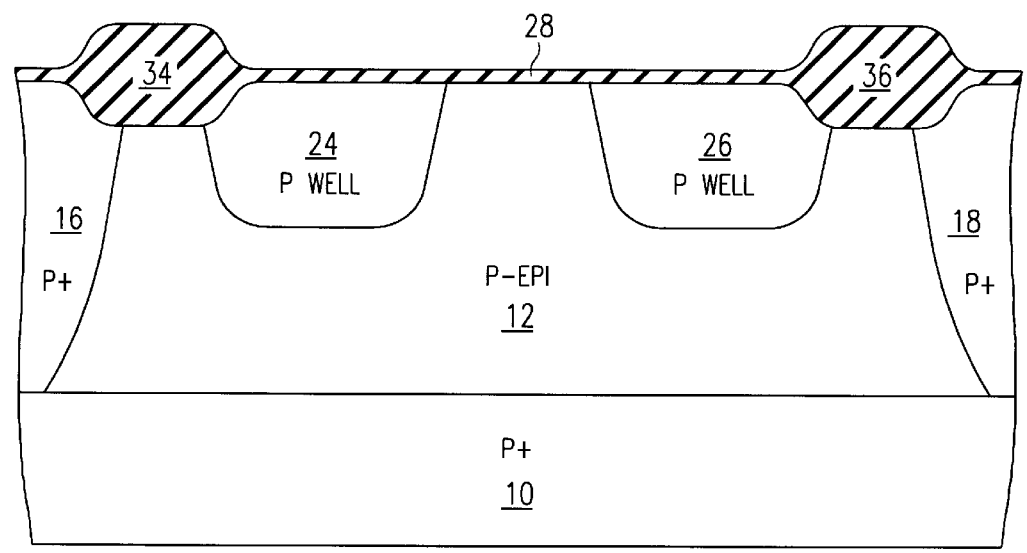

Referring to FIG. 1d, field oxide regions 34 and 36 are formed as a result of the local oxidation process. As shown in FIG. 1d, following the local oxidation process, nitride layer 30 is also stripped.

Figure 1E:
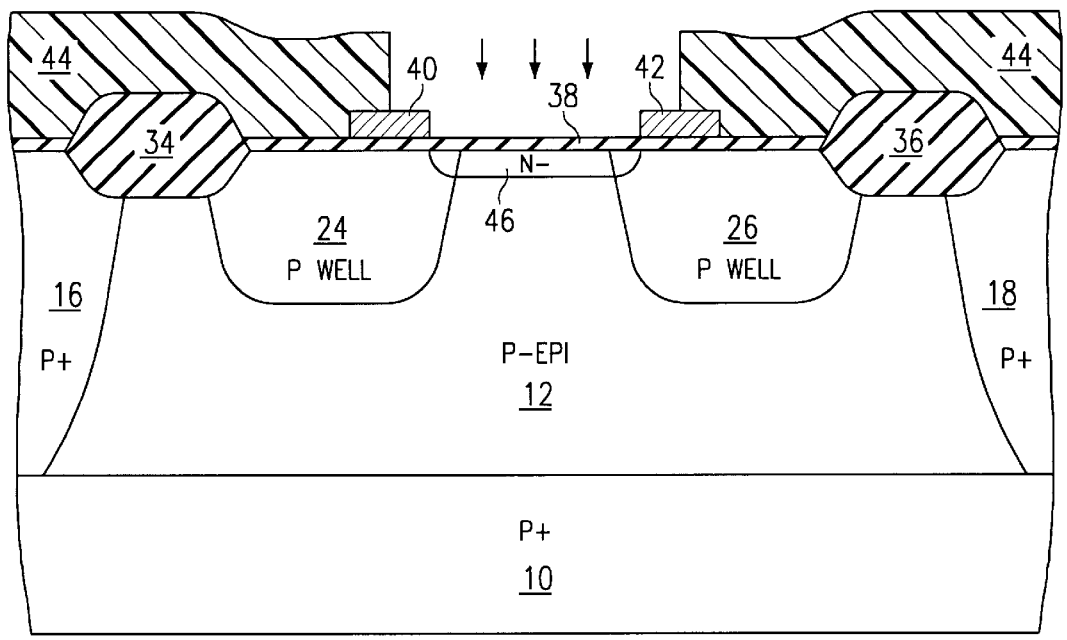

Referring to FIG. 1e, the outer surface of epitaxial layer 12 between field oxide region 34 and field oxide region 36 is stripped of all oxide through a blanket oxide deglaze. A sacrificial gate oxide (not shown) is then grown in this region and stripped. Finally, a gate oxide layer 38 is grown covering the entire surface between region 34 and 36 and over regions 16 and 18. A layer of polysilicon is then deposited, patterned and etched using conventional photolithographic techniques to form polysilicon gates 40 and 42 shown in FIG. 1e. A layer of photoresist 44 is then deposited and then patterned to expose the region between polysilicon gates 40 and 42. The region between gates 40 and 42 will eventually comprise the drain of the power device while the regions between gate 40 and region 34, and gate 42 and region 36 will comprise the source of the device. A combination of arsenic and phosphorous ions are then implanted into the region between gates 40 and 42, self-aligned to the inner edges of gates 40 and 42 to form n-region 46. N-region 46 is on the order of 0.28 to 0.3 microns in depth. This region will eventually form a RESURF drift region which provides the increase in the breakdown voltage of the device while providing an adequately low resistance to the channel of the device.

Figure 1F:
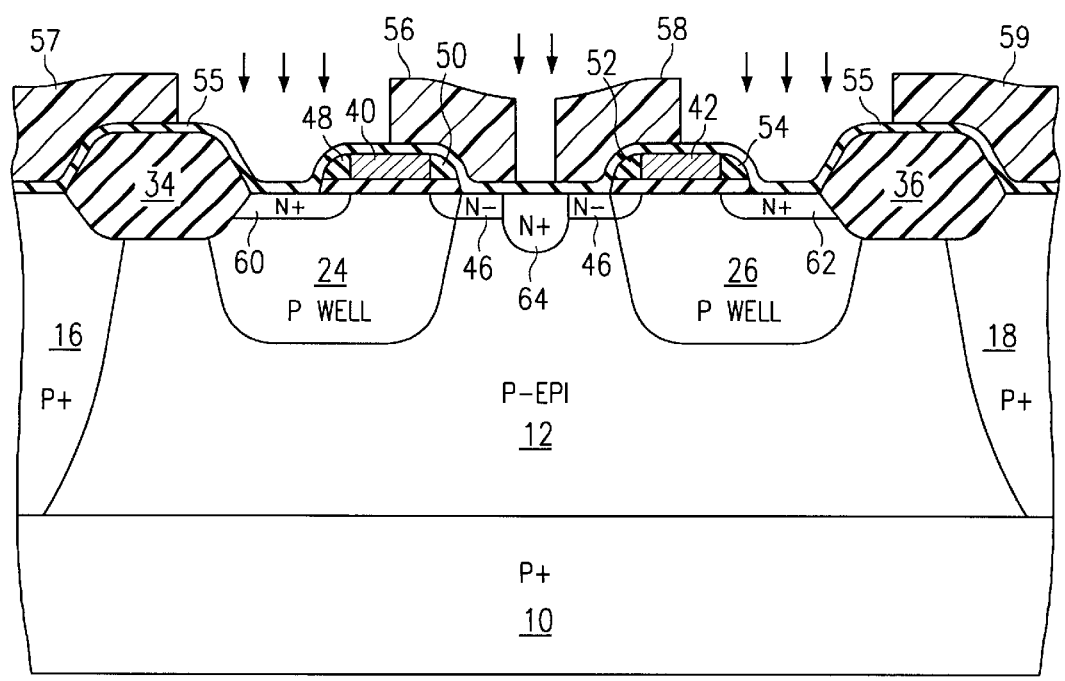

FIG. 1f illustrates the series of steps used to form the source and drain n+ regions of the device. First, a layer of oxide is deposited outwardly from the entire surface on the outer surface of he device. This layer is then anisotropically etched to form sidewall spacer bodies 48 and 50 on opposite edges of gate body 40 and sidewall spacer bodies 52 and 54 disposed on opposite edges of gate body 42. At this point, a thin layer 55 of tetraethylorthosilicate (TEOS) is deposited over the entire outer surface. Layer 55 helps to reduce damage to the substrate during later implantation steps. Layer 55 is on the order of 300 angstroms in thickness.

A layer of photoresist is then deposited and patterned to form photoresist mask bodies 56, 57, 58 and 59 shown in FIG. 1f. The opening between mask body 56 and mask body 58 is roughly centered in the drain region between sidewall body 50 and sidewall body 52. An implant of arsenic ions at a concentration of 3E15 ions per square centimeter is then performed to create source n+ region 60 and 62 and drain n+ region 64. Mask bodies 56 and 58 operate to space the edges of drain n+ region 64 away from the channel region disposed inwardly from polysilicon gate 40 and polysilicon gate body 42. The mask bodies 56 and 58 are then stripped away.

Figure 1G:
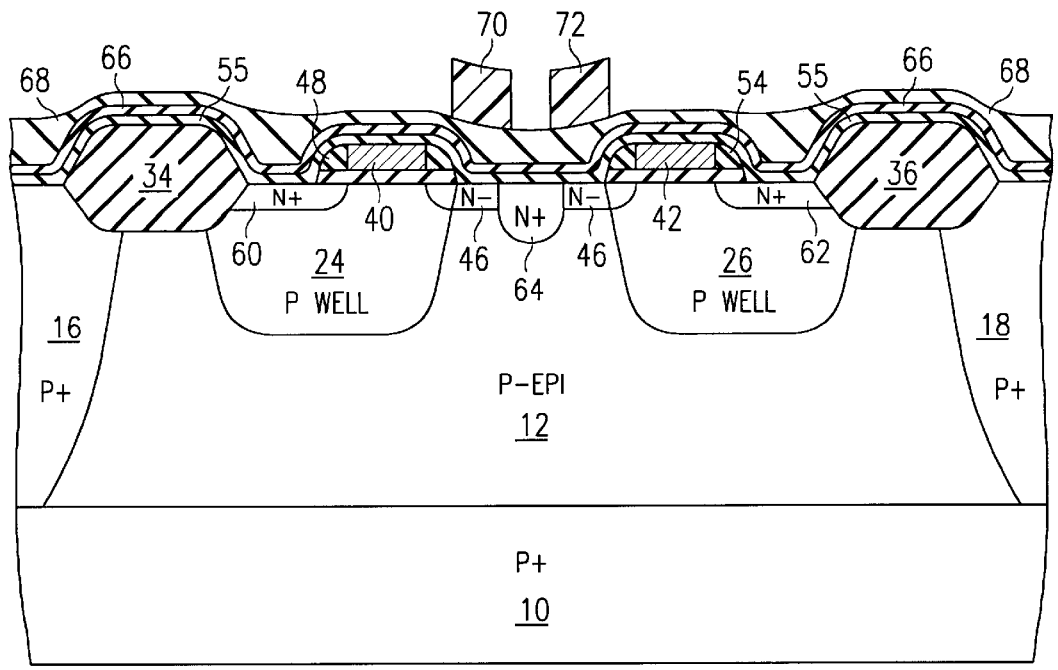

Referring to FIG. 1g, a layer of TEOS 66 is deposited to evenly cover the entire outer surface of the structure. Subsequently, a layer 68 of spin-on glass or boron phosphate silicate glass is then deposited covering the outer surface of layer 66. Both spin-on glass and boron phosphate silicate glass which is reflowed are materials which will not cover the outer surface evenly but will tend to puddle in depressions within the outer surface and form thinner regions of layer 68 over protrusions in the outer surface, such as the protrusions caused by the structures associated with polysilicon gate 40, polysilicon gate 42 and field oxide regions 34 and 36.

A layer of photoresist is then deposited and patterned to form mask bodies 70 and 72 as shown in FIG. 1g. Mask bodies 70 and 72 ensure that there will be some material remaining separating the outer surface of drain region 64 from the outer surface of both polysilicon gate 40 and polysilicon gate 42. According to the teachings of the present invention, the outer surface of gates 40 and 42 and the outer surface of drain region 64 between resist region 70 and 72 will be coated with platinum silicide to dramatically reduce the contact resistance of these regions. It is critical, however, that the silicide layers on the gates 40 and 42 and the silicide layers to be formed on the drain 64 must not come into contact with one another or come too close to one another, which can result in either a short in the device or a reduced voltage breakdown in the operation of the device. In addition, the silicide layers will be formed in contact with source regions 60 and 62.

The final structure shown in FIG. 1g is then anisotropically etched. This etching process is continued until the outer surfaces of gate bodies 40 and 42, the outer surface of drain region 64 and the outer surface of source regions 60 and 62 are exposed. Because of the configuration of layer 68 and the formation of mask bodies 70 and 72, the outer surfaces of gate bodies 40 and 42, the outer surface of drain region 64 and the outer surface of source regions 60 and 62 will be exposed during the etching process. While sidewall bodies 48 and 54 maintain independent integrity of the source regions 60 and 62 and the gates 40 and 42 and mask bodies 70 and 72 adequately space the drain silicide to be formed from the gates 40 and 42 and gate silicide layer to be formed to maintain the BVdss of the transistor.

Figure 1H:
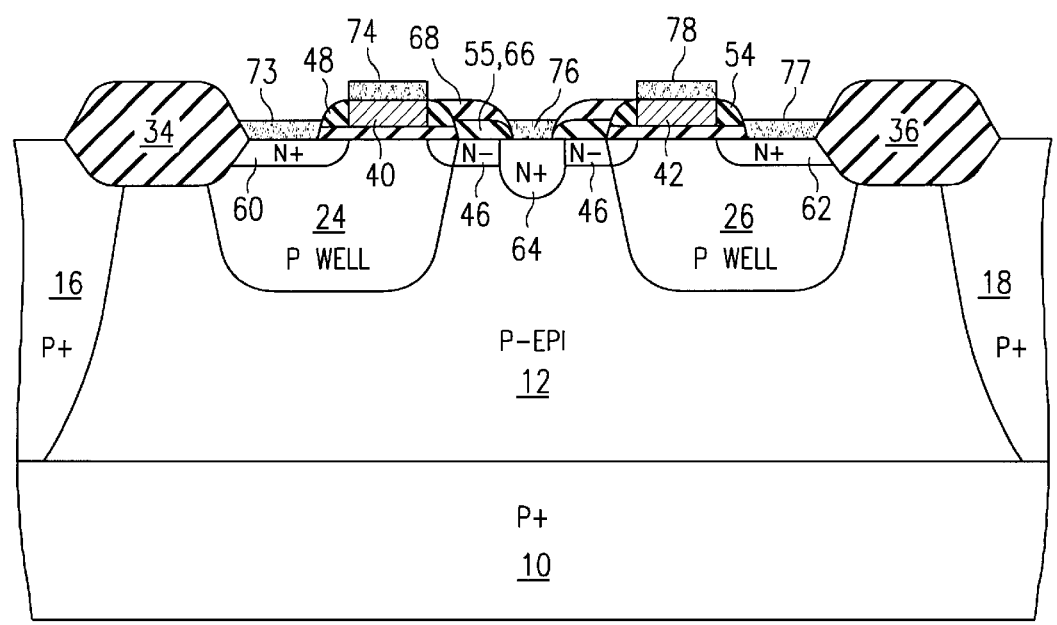

Referring to FIG. 1h, a layer of platinum is then deposited covering the entire outer surface and then sintered to form a platinum silicide layer 74 in contact with the entire polysilicon gate body 40, a platinum silicide layer 76 in contact with drain region 64, a platinum silicide body 78 in contact with polysilicon gate body 42 and platinum silicide bodies 75 and 77 in contact with source regions 60 and 62, respectively. The structure is then subjected to aqua regia etch which removes all platinum which has not reacted to form platinum silicide layers 73, 74, 76, 77 and 78.

Conventional techniques can then be used to contact source silicide layers 75, and 77, gate silicide layers 74 and 78 and drain silicide layer 76. In addition, implant procedures can be interposed within the method of the present invention to provide p+ contacts to p-well regions 24 and 26 by implanting p+ regions within the boundaries of n+ regions of 60 and 62.

According to an alternate embodiment of the present invention, the formation of the silicide layers in contact with the gate bodies and the formation of the silicide layers in contact with the source and drain regions of the transistor can be formed in two sequential steps. According to this embodiment, the formation of mask bodies 70 and 72 would be omitted and a simple etchback process would be used to expose the outer surfaces of gate bodies 40 and 42. The gate silicide layers 74 and 78 could then be formed in contact with the gate bodies 40 and 42, respectively. During the conventional formation of contacts to the source regions 60 and 62 and to the drain region 64, silicide layers within the contact regions could also be formed. According to this embodiment of the present invention, the gate bodies comprise silicide layers covering the entire structures and the source and drain regions comprise silicide layers which only are formed in the small contact openings formed to the region.

According to an alternate embodiment of the present invention, a different two-step solution could be used. The same initial process step could be used to form gate silicide layers 74 and 78 in contact with gate bodies 40 and 42, respectively. Mask bodies 70 and 72 could then be formed in later processing steps but the mask bodies 70 and 72 could be enlarged to cover the area outward from the newly-formed gate silicide layers 74 and 78. According to this embodiment, after the formation of mask bodies 70 and 72, openings could be formed to expose source regions 60 and 62 and drain region 64. Silicide layers 75,76 and 77 could then be formed in contact with the entire source regions 60 and 62 and the entire drain region 64. This embodiment requires two silicidation steps but provides for silicide over the entire source and drain regions as opposed to the small contact openings to these regions. It should also be understood that the embodiment of the present invention that uses two separate silicidation steps could be formed in either order. In other words, the silicidation of the source and drain regions could occur prior to the silicidation of the gate bodies 40 and 42.

An important technical advantage of the present invention is that it allows for the use of platinum silicide for contact regions to lower contact resistances to gates and source and drain regions of a field effect device. Platinum silicide is commonly used in the formation of Schottky diodes in the production of bipolar or BI-CMOS systems. The processing methods of the present invention allow for the formation of low resistance platinum silicide contact layers at the same time that platinum silicide techniques are used to form the Schottky devices. Accordingly, Schottky devices and silicide contact layers can be formed using a single silicidation step as opposed to conventional techniques which require the use of platinum silicide for the formation of the Schottky devices and tungsten silicide for the formation of contact layers. If the formation of Schottky devices elsewhere in the system are not required, titanium silicide can be substituted throughout the teachings of the present invention for the platinum silicide. For example, the contact layers formed using platinum silicide could also be formed using titanium silicide.

Accordingly, the structure disclosed provides for extremely low contact resistance associated with platinum silicide contacts for the gate conductors, drain conductors, and source conductors. In addition, the processes used ensure that the device will be safe from gate-to-drain shortages and from gate-to-drain breakdown.

Although the present invention has been described in detail, it should be understood that various changes, alterations, modifications and substitutions may be made to the teachings herein without departing from the spirit and scope of the present invention which is solely defined by the appended claims.

What is claimed is:

1. A method of forming a high current field effect transistor comprising the steps of:

forming a semiconductor substrate of a first conductivity type having an outer surface;

forming a polycrystalline semiconductor gate body having an outer surface and separated from said outer surface of said semiconductor substrate by a gate insulator layer;

forming a conductive drain region of opposite conductivity type in said outer surface of said substrate and spaced apart from said gate body;

forming a platinum silicide gate contact layer disposed on the outer surface of said gate body; and forming a platinum silicide drain contact layer disposed on said outer surface of said drain region and spaced apart from said gate body and said platinum silicide gate contact layer;

wherein the steps of forming a platinum silicide drain contact layer and platinum silicide gate layer comprise the steps of depositing a layer of conformal oxide outwardly from the surface of the substrate and the outer surfaces of the gate conductor body;

depositing a layer of non-conformal insulative material outwardly from the layer of conformal oxide;

forming a photoresist mask body disposed between the gate conductor body and the conductive drain region;

anisotropically etching said insulative material through said mask to expose only the outer surface of the gate conductor layer and the outer surface of the conductive drain region;

depositing a layer of platinum covering at least the exposed outer surfaces of the gate conductor body and the drain region; and sintering the platinum layer to form the platinum silicide gate contact layer and the platinum suicide drain contact layer.

2. The method of claim 1 wherein the step of depositing a layer of non-conformal insulative material comprises the step of depositing a layer of spin-on-glass.

3. The method of claim 1 wherein the step of depositing a layer of non-conformal insulative material comprises the step of depositing a layer of boron phosphate silicate glass that has been reflowed.

4. The method of claim 1 wherein the step of depositing a layer of conformal oxide comprises the step of depositing a layer of tetraethylorthosilicate.

* * * * *